United States Patent
Greene et al.

(10) Patent No.: US 9,601,335 B2
(45) Date of Patent: Mar. 21, 2017

(54) TRENCH FORMATION FOR DIELECTRIC FILLED CUT REGION

(71) Applicants: INTERNATIONAL BUSINESS MACHINES CORPORATION, Armonk, NY (US); GLOBALFOUNDRIES, INC., Grand Cayman (KY)

(72) Inventors: Andrew M. Greene, Albany, NY (US); Ryan O. Jung, Glenmont, NY (US); Ruilong Xie, Niskayuna, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/282,836

(22) Filed: Sep. 30, 2016

(65) Prior Publication Data
US 2017/0033196 A1    Feb. 2, 2017

Related U.S. Application Data

(62) Division of application No. 14/810,143, filed on Jul. 27, 2015.

(51) Int. Cl.
*H01L 21/28* (2006.01)
*H01L 23/60* (2006.01)
(Continued)

(52) U.S. Cl.
CPC .......... *H01L 21/28123* (2013.01); *H01L 21/823814* (2013.01); *H01L 21/823821* (2013.01);
(Continued)

(58) Field of Classification Search
CPC ....... H01L 21/28123; H01L 21/823814; H01L 21/823821; H01L 29/42368;
(Continued)

(56) References Cited

U.S. PATENT DOCUMENTS 7,488,650 B2   2/2009 Schulz
7,713,887 B2   5/2010 Eun
(Continued)

OTHER PUBLICATIONS

List of IBM Patents or Patent Applications Treated as Related dated Sep. 30, 2016, 2 pages.

*Primary Examiner* — Dao H Nguyen
(74) *Attorney, Agent, or Firm* — Tutunjian & Bitetto, P.C.; Vazken Alexanian

(57) ABSTRACT

A method for forming a gate cut region includes forming a tapered profile gate line trench through a hard mask, a dummy layer and a dummy dielectric formed on a substrate, forming a dummy gate dielectric and a dummy gate conductor in the trench and planarizing a top surface to reach the hard mask. The dummy gate conductor is patterned to form a cut trench in a cut region. The dummy gate conductor is recessed, and the cut trench is filled with a first dielectric material. The dummy layer is removed and spacers are formed. A gate line is opened up and the dummy gate conductor is removed from the gate line trench. A gate dielectric and conductor are deposited, and a gate cap layer provides a second dielectric that is coupled to the first dielectric material in the cut trench to form a cut last structure.

13 Claims, 15 Drawing Sheets

(51) Int. Cl.
*H01L 21/84* (2006.01)
*H01L 21/8238* (2006.01)
*H01L 29/423* (2006.01)
*H01L 27/092* (2006.01)
*H01L 29/08* (2006.01)
*H01L 29/06* (2006.01)
*H01L 27/12* (2006.01)

(52) U.S. Cl.
CPC .......... *H01L 23/60* (2013.01); *H01L 27/0924* (2013.01); *H01L 27/1211* (2013.01); *H01L 29/0653* (2013.01); *H01L 29/0847* (2013.01); *H01L 29/42368* (2013.01)

(58) Field of Classification Search
CPC ............. H01L 29/0653; H01L 29/0847; H01L 27/0924; H01L 27/1211; H01L 23/60
USPC .......... 438/157, 163, 266, 268; 257/77, 368, 257/347, 401, E21.409, E27.06, E29.104, 257/E29.255
See application file for complete search history.

(56) References Cited

U.S. PATENT DOCUMENTS

| | | | |
|---|---|---|---|
| 8,202,780 B2 | 6/2012 | Ren et al. | |
| 8,389,359 B2 | 3/2013 | Teo et al. | |
| 8,637,359 B2 | 1/2014 | Chang et al. | |
| 8,673,725 B2 | 3/2014 | O'Meara et al. | |
| 8,916,950 B2 | 12/2014 | Kim et al. | |
| 9,373,641 B2* | 6/2016 | Anderson | H01L 27/1211 |
| 2011/0147765 A1* | 6/2011 | Huang | H01L 21/28123 257/77 |
| 2013/0309856 A1 | 11/2013 | Jagannathan et al. | |
| 2014/0191333 A1 | 7/2014 | Chang et al. | |
| 2014/0252476 A1* | 9/2014 | Chang | H01L 29/0692 257/347 |
| 2015/0054089 A1* | 2/2015 | Hong | H01L 27/0886 257/401 |
| 2016/0163604 A1* | 6/2016 | Xie | H01L 21/823878 257/401 |
| 2016/0233094 A1* | 8/2016 | Anderson | H01L 27/1211 |

* cited by examiner

TRENCH FORMATION FOR DIELECTRIC FILLED CUT REGION

BACKGROUND

Technical Field

The present invention relates to semiconductor processing, and more particularly to processes and devices with improved cut region dielectric fill to avoid shorting between structures.

Description of the Related Art

One commonly employed technique for forming gate structures involves forming a line-type gate electrode structure above a layer of insulating material that is formed above an active region defined in a semiconductor substrate. Typically, the line-type gate electrode structures are formed by defining long parallel line-type structures, i.e., gate electrode structures that extend across multiple spaced-apart active regions and the isolation regions formed in the substrate between such spaced-apart active regions. At some point later in the process flow, these long, line-type gate electrode structures are subsequently "cut" by performing an etching process to define the gate electrodes having the desired length.

After the gate electrodes are patterned, a sidewall spacer is typically formed around the perimeter of the substantially rectangular shaped gate structure, i.e., the spacer is formed adjacent on all four side sidewalls (two sidewalls and two end surfaces) of each of the patterned gate electrodes. In some cases, a thin liner layer may be formed on the gate structure prior to forming the sidewall spacer. The sidewall spacer, in combination with the gate cap layer, functions to protect the gate electrode structure in subsequent processing operations.

In the case where transistor devices are manufactured using so-called gate-first processing techniques, the gate structures (gate electrode plus the gate insulation layer) formed as described above are final gate structures for the device. In the situation where transistor devices are manufactured using so-called gate-last processing techniques, the gate structures (gate electrode and gate insulation layer) formed as described above are sacrificial in nature and will be subsequently removed (after several process operations are performed) and replaced with a final gate structure for the device. In the gate-last processing technique, the final gate structure typically includes one or more layers of high-k insulating material and one or more layers of metal that constitute at least part of the conductive gate electrode of the final gate structure.

Unfortunately, as device dimensions have decreased and packing densities have increased, it is more likely that, when epi semiconductor material is formed in the source/drain regions, some of the epi material may undesirably form on the end surfaces of the polysilicon/amorphous silicon gate electrode. As packing densities have increased, the end-to-end spacing between two different gate electrode structures formed above two different active regions has decreased, thereby limiting the physical size, i.e., the width, of the protective sidewall spacers. Additionally, as the pitch between adjacent gate structures has decreased, the width of the protective sidewall spacers must also be decreased.

For example, in 7 nm technology processing, a few challenges or issues include the following. In replacement metal gate recess processing, the gate length is too narrow, work function metal (WFM) tends to pinch-off during deposition. It is very difficult to recess the WFM if there is a void in the WFM. In forming the gate shape, a spacer image transfer (SIT) process may be employed. A lithography, etch, lithography, etch (LELE) is very difficult to use to pattern the gate shape (however, LELE makes it is easy to define trench shapes). With SIT, it is not straightforward to define certain device types (e.g., WIMPY devices), and separate mask sets are needed for other device types (e.g., for long channel devices). Epi shorts at gate line-ends can occur since pass fins at the line end are so small. Epitaxial lateral growth can easily short source/drains (S/D) around the gate structure. Contact etch shorts at the gate line-end are also issues since there is usually more damage to gate line-ends than line-sides during spacer and contact etches. In addition, the 7 nm spacer target thickness is only 6 nm. While the shorts due to etching may be mitigated with a gate cut last process, this processing would require two flowable oxide fills, which creates a thermal budget issue, especially for high percentage Ge, SiGe fins, and this adds processing time and expense.

SUMMARY

A method for forming a gate cut region includes forming a tapered profile gate line trench through a hard mask, a dummy layer and a dummy dielectric formed on a substrate, forming a dummy gate dielectric and a dummy gate conductor in the trench and planarizing a top surface to reach the hard mask. The dummy gate conductor is patterned to form a cut trench in a cut region. The dummy gate conductor is recessed to expose a shallow trench isolation region in the substrate, and the cut trench is filled with a first dielectric material. The dummy layer is removed and spacers are formed about a gate line. An interlevel dielectric (ILD) deposition fills gaps. The gate line is opened up to expose and remove the dummy gate conductor from the tapered profile gate line trench.

Another method for forming a gate cut region includes forming shallow trench isolation (STI) regions in a substrate wherein one STI region corresponds to a central portion of a cut region; forming a hard mask, a dummy layer and a dummy dielectric on the substrate; etching a tapered profile gate line trench through the hard mask, the dummy layer and the dummy dielectric; forming a dummy gate dielectric and a dummy gate conductor in the trench; planarizing a top surface to reach the hard mask; patterning the dummy gate conductor to form a cut trench in the cut region; recessing the dummy gate conductor to expose the one STI region in the substrate; filling the cut trench with a first dielectric material; removing the dummy layer; forming spacers about a gate line exposed by removing the dummy layer; epitaxially growing source and drain regions adjacent to the spacers; filling gaps using an interlevel dielectric (ILD) deposition; planarizing the ILD to open up the gate line to expose and remove the dummy gate conductor from the tapered profile gate line trench; depositing a gate dielectric and gate conductor in the tapered profile gate line trench; and forming a gate cap layer to cap a gate structure and provide a second dielectric that is coupled to the first dielectric material in the cut trench to form a cut last structure.

A device having a gate cut region includes a tapered profile gate line formed on a substrate. The tapered profile gate line includes a gate dielectric and a gate metal formed within the tapered profile and spacers formed on sidewalls of the tapered profile gate line. Source and drain regions are formed adjacent to the spacers. A cut last structure is formed in a mid-portion along the tapered profile gate line in a cut region. The cut region includes a first dielectric material formed on a shallow trench isolation region in the substrate and a second dielectric material forming a gate cap layer and forming vertical interface regions between the gate cap layer and the first dielectric material.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
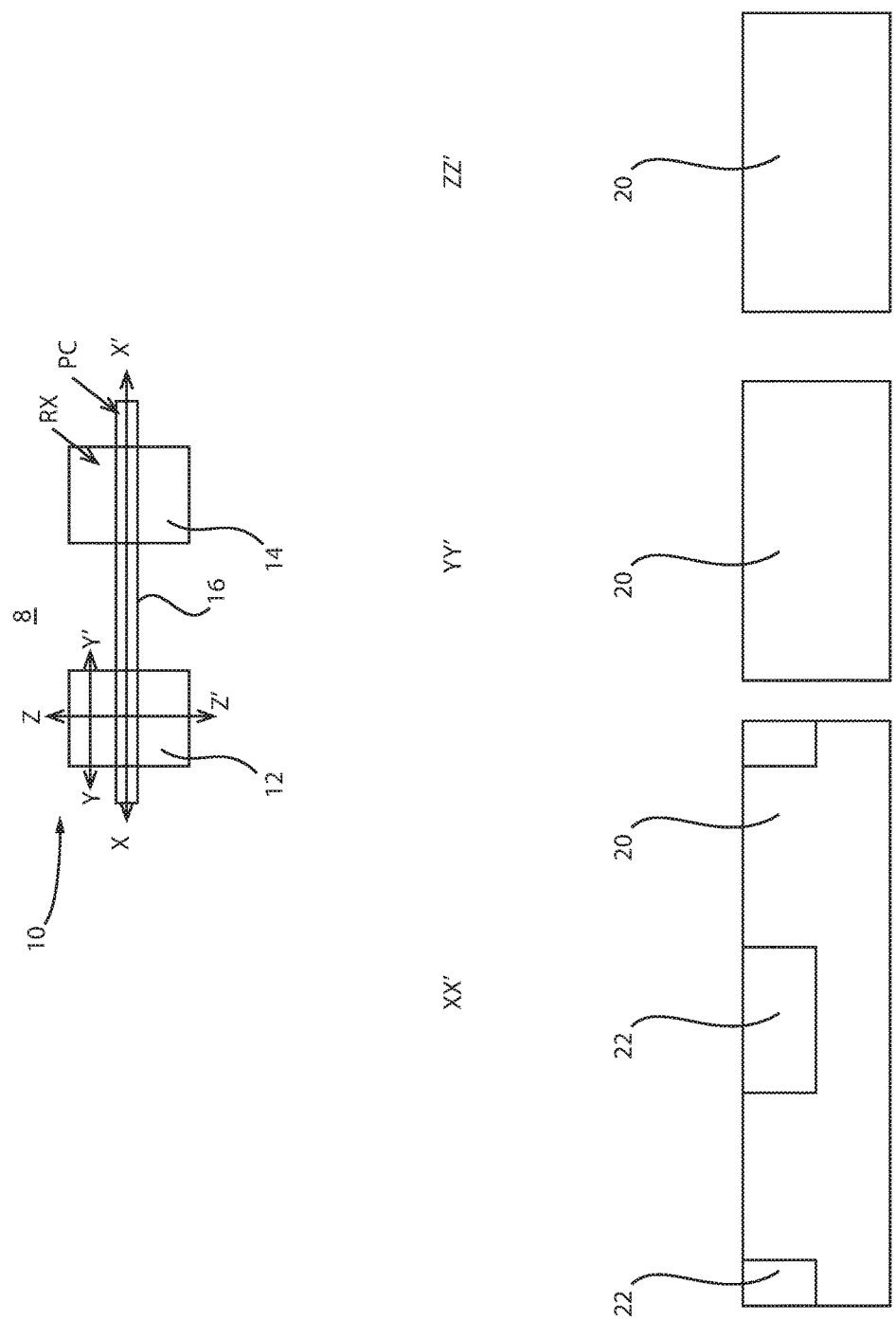
FIG. 1 is a cross-sectional view of a semiconductor device showing a schematic top view and two cross-sectional views depicting a formation of shallow trench isolation regions in a substrate in accordance with the present principles.

In accordance with the present principles, methods and devices are provided that assist is improving the reliability of semiconductor devices and, in particular, improving the electrical isolation provided by gate cut regions. In accordance with particularly useful embodiments, line end epitaxial (epi) region shorts and line end epi nodules are avoided, resulting in a larger epitaxial growth process window for forming source and drain regions (S/D regions). Contact and silicide region shorts are also reduced or avoided completely by the line end cut region. This enables local interconnect structures. The gate cut region has no residual silicon material, generates no defects and provides a good gap fill after the cut. Interlevel dielectric (ILD) loss is also minimized.

In conventional devices, it is not uncommon that some portion of the polysilicon or amorphous silicon dummy gate electrode material will be exposed at the time epi semiconductor material is formed in the source/drain regions of a planar or finFET device. As a result, epi semiconductor material will undesirably form on the exposed portions of a dummy gate electrode layer. The extent and amount of undesirable epi semiconductor material formation will vary depending upon the particular application and the quality of the manufacturing processes used to manufacture the device. In a worst case scenario, this undesirable epi semiconductor material may form around the entire end surface of a particular gate electrode so as to effectively form a conductive "bridge" between one or both of the source/drain regions and the gate electrode.

In another example, such undesirable epi semiconductor material may span the space between the opposing end surfaces of two spaced-apart gate electrode structures, wherein the epi material may form on one or both of the spaced-apart gate structures. This epi "nodule" growth can prevent self-aligned contact trench etching down to the fins, which causes contact with no flow of electrical current. As a result of such undesirable and unpredictable epi formation, the resulting semiconductor devices and the integrated circuits including such devices may completely fail or operate at less than acceptable performance levels.

The present principles address these shortcomings of conventional devices by providing a cut last region that is formed during a gate formation process flow. The present principles provide isolation from epitaxial shorts for source and drain regions as well as shorts due to contacts and silicide regions associated with the contacts. In one embodiment, gate formation is improved by employing a tapered gate opening for the deposition of gate metal without pinch-off.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements, FIGS. 1-13 each include an illustrative top view 10 of device 8, which includes a section line XX' along a polysilicon contact replacement gate (PC) region 16, a section line YY' perpendicular through an epi/fin contact area in an active region (RX) 12, and a section line ZZ' perpendicular to the section line YY' through the active gate which aligns along the fin direction in the active region 12. Cross-sectional views at each of XX', YY' and ZZ' are shown in each of FIGS. 1-13. A cut region will be fabricated between active regions (RX) 12 and 14 as well be described. It should be understood that process flow may be applied to gate first or dummy gate structures. The following description illustratively describes a process with dummy gate structures.

Referring now to the drawings in which like numerals represent the same or similar elements and initially to FIG. 1, a substrate 20 is shown having shallow trench isolation (STI) regions 22 formed therein. The substrate 20 may include a bulk substrate, a semiconductor-on-insulator (SOI) substrate or any other suitable substrate. The substrate 20 may include silicon, germanium, SiGe, or other suitable materials. It should be understood that the present principles may be applied to planar device fabricating, fin device fabrication or any other device type fabrication process.

Figure 2:
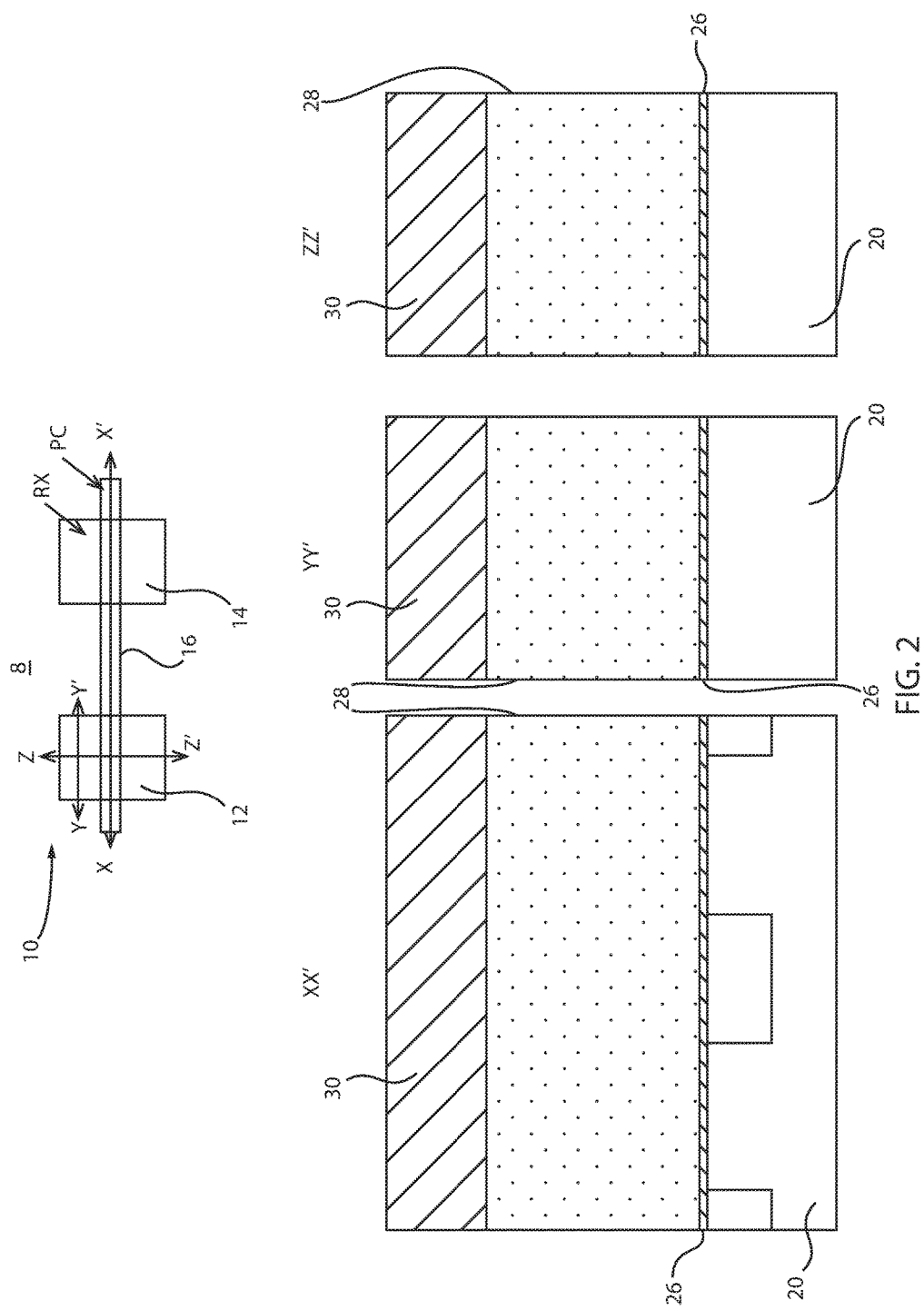
FIG. 2 is a cross-sectional view of the semiconductor device of FIG. 1 showing a schematic top view and two cross-sectional views depicting formation of a dummy dielectric, dummy layer and hard mask layer in accordance with the present principles.

Referring to FIG. 2, a dummy gate dielectric 26 is formed on the substrate 20 and over the STI regions 22. The dummy gate dielectric 26 may include an oxide that is grown or deposited. A dummy layer 28 is formed over the dummy gate dielectric 26 by a deposition process, e.g., a chemical vapor deposition (CVD) or the like. The dummy layer 28 may include amorphous silicon or polysilicon. A hard mask 30 is formed on the dummy layer 28. The hard mask 30 may include a nitride (e.g., SiN).

Figure 3:
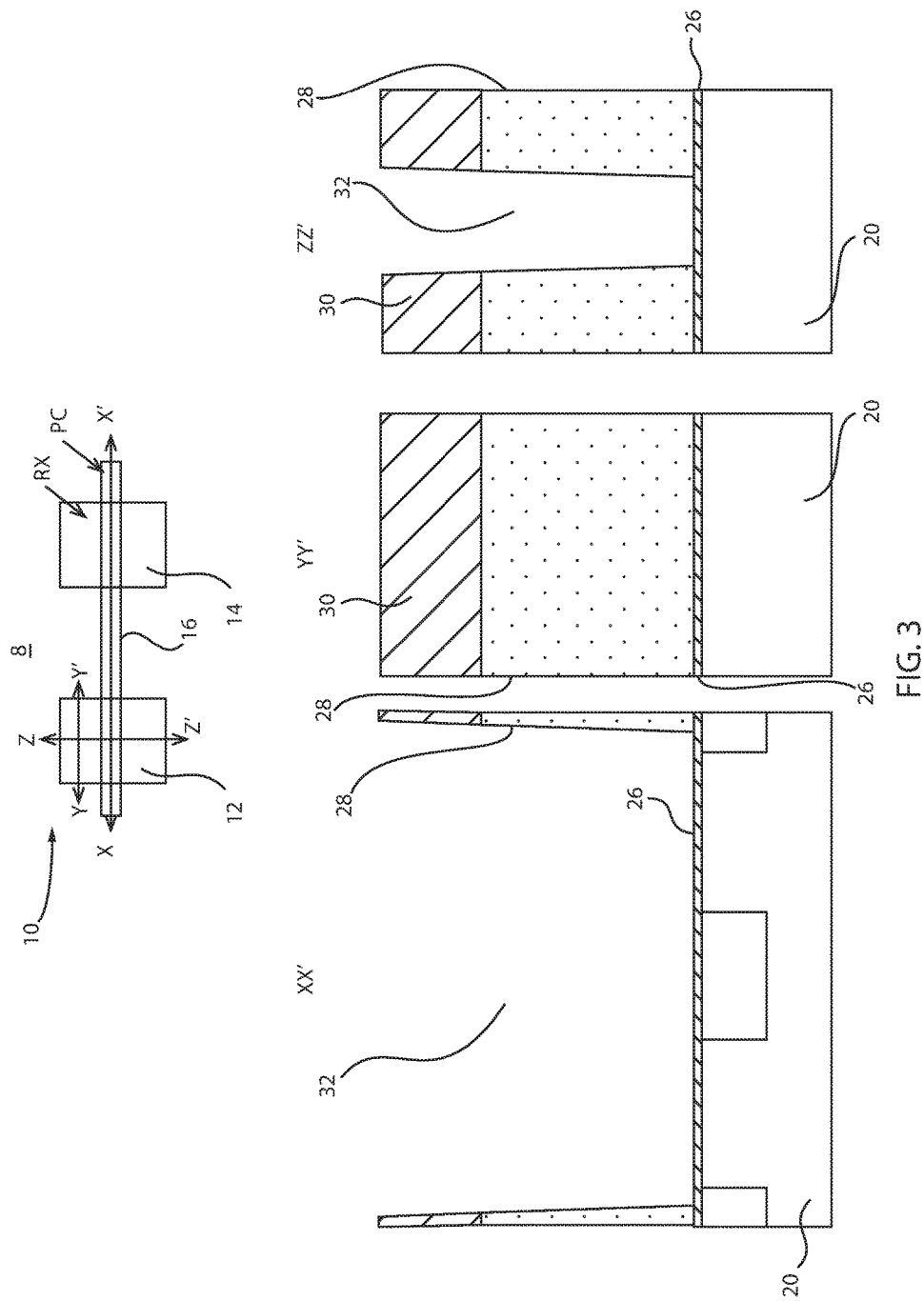
FIG. 3 is a cross-sectional view of the semiconductor device of FIG. 2 showing a schematic top view and two cross-sectional views depicting a tapered profile gate line etched into the dummy dielectric, dummy layer and hard mask layer in accordance with the present principles.

Referring to FIG. 3, a trench 32 is etched for placement of a gate structure and the formation of a cut region. The trench 32 extends along XX' and has a profile as depicted in section ZZ'. The trench 32 includes a tapered profile (in section ZZ'). The tapered profile may be etched by a LELE process (lithography, etch, lithography, etch or double lithography, double etch). The LELE process enables small dimensions (e.g., 5 nm-20 nm, or larger) and controlled profiles (e.g., uniform tapering).

Figure 4:
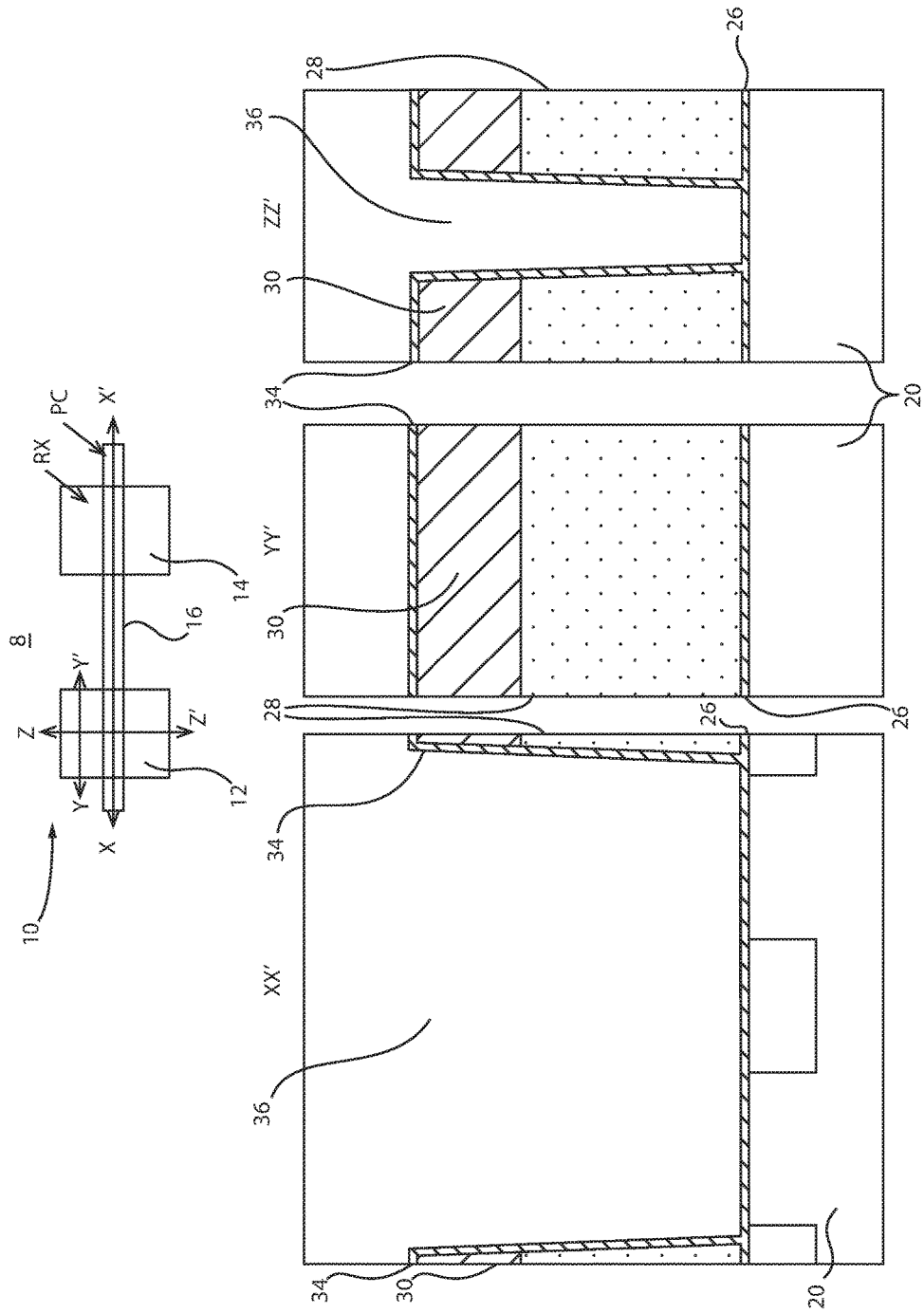
FIG. 4 is a cross-sectional view of the semiconductor device of FIG. 3 showing a schematic top view and two cross-sectional views depicting a dummy gate dielectric and a dummy gate conductor formed in the tapered profile gate line in accordance with the present principles.

Referring to FIG. 4, another dummy dielectric layer 34 (similar to layer 26) is deposited over a top surface and in the trench 32. The trench 32 is then filled with a dummy gate layer 36. The dummy gate layer 36 may include amorphous silicon or polysilicon material 36. The top surface can be planarized using a chemical mechanical polish (CMP) process down to the hard mask 30.

Figure 5:
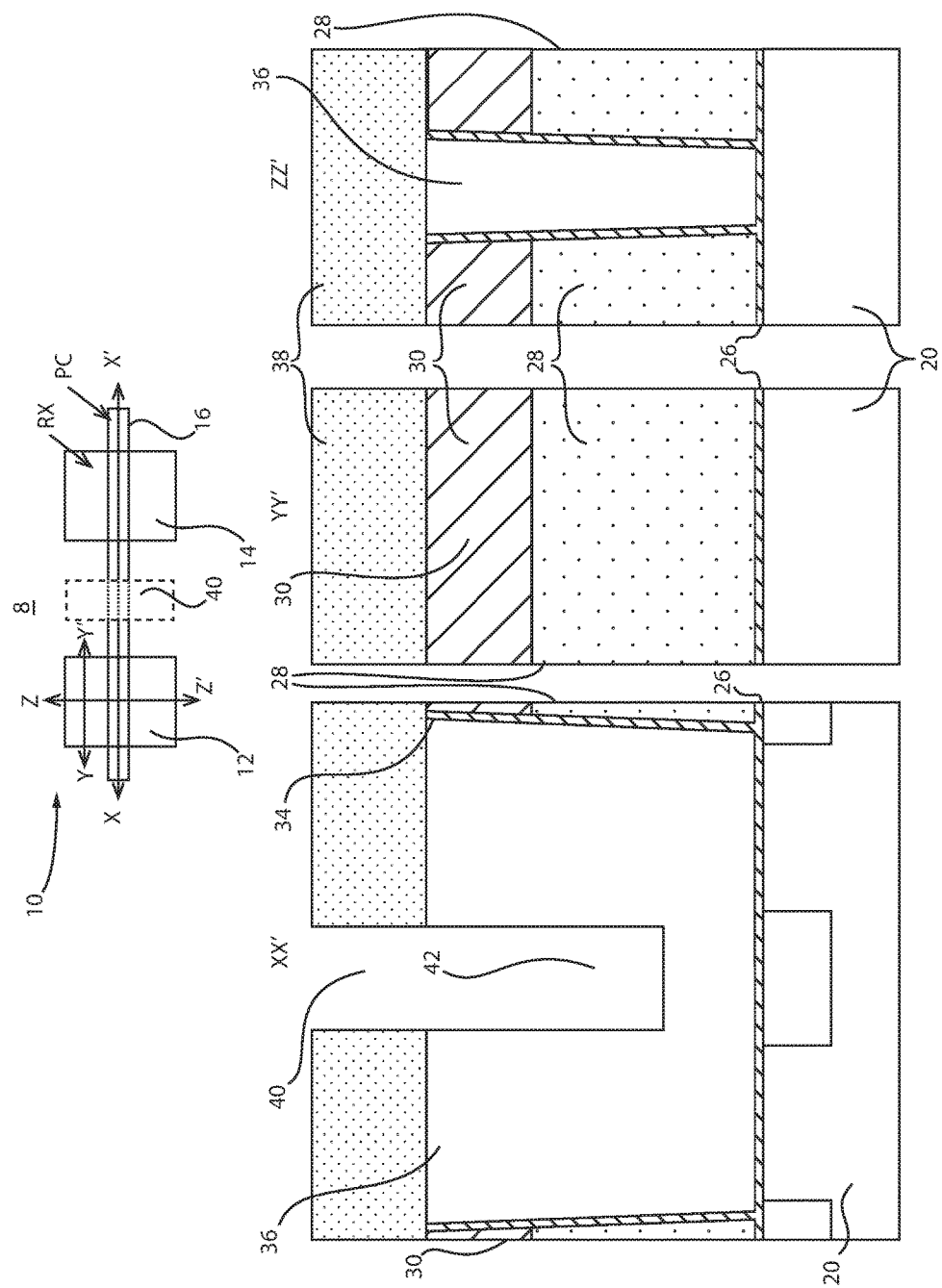
FIG. 5 is a cross-sectional view of the semiconductor device of FIG. 4 showing a schematic top view and two cross-sectional views depicting a patterning process and subsequent partial dummy gate recess etching in a cut region in accordance with the present principles.

Referring to FIG. 5, an organic planarizing (or patterning) layer (OPL) 38 (or organic dielectric layer (ODL)) is deposited over a top surface of the device on the amorphous silicon material 36. The OPL 38 is patterned using a cut mask (CT) to form an opening 40 in the OPL 38 in a cut region (between regions 12 and 14). The OPL 38 may include a photo-sensitive organic polymer comprising a light-sensitive material that, when exposed to electromagnetic (EM) radiation, is chemically altered and thus configured by the cut mask (not shown) to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, poly(methyl methacrylate) or benzocyclobutene (BCB). The OPL 38 provides an etch mask to etch into the material 38 to partially recess the material and form a trench 42.

Figure 6:
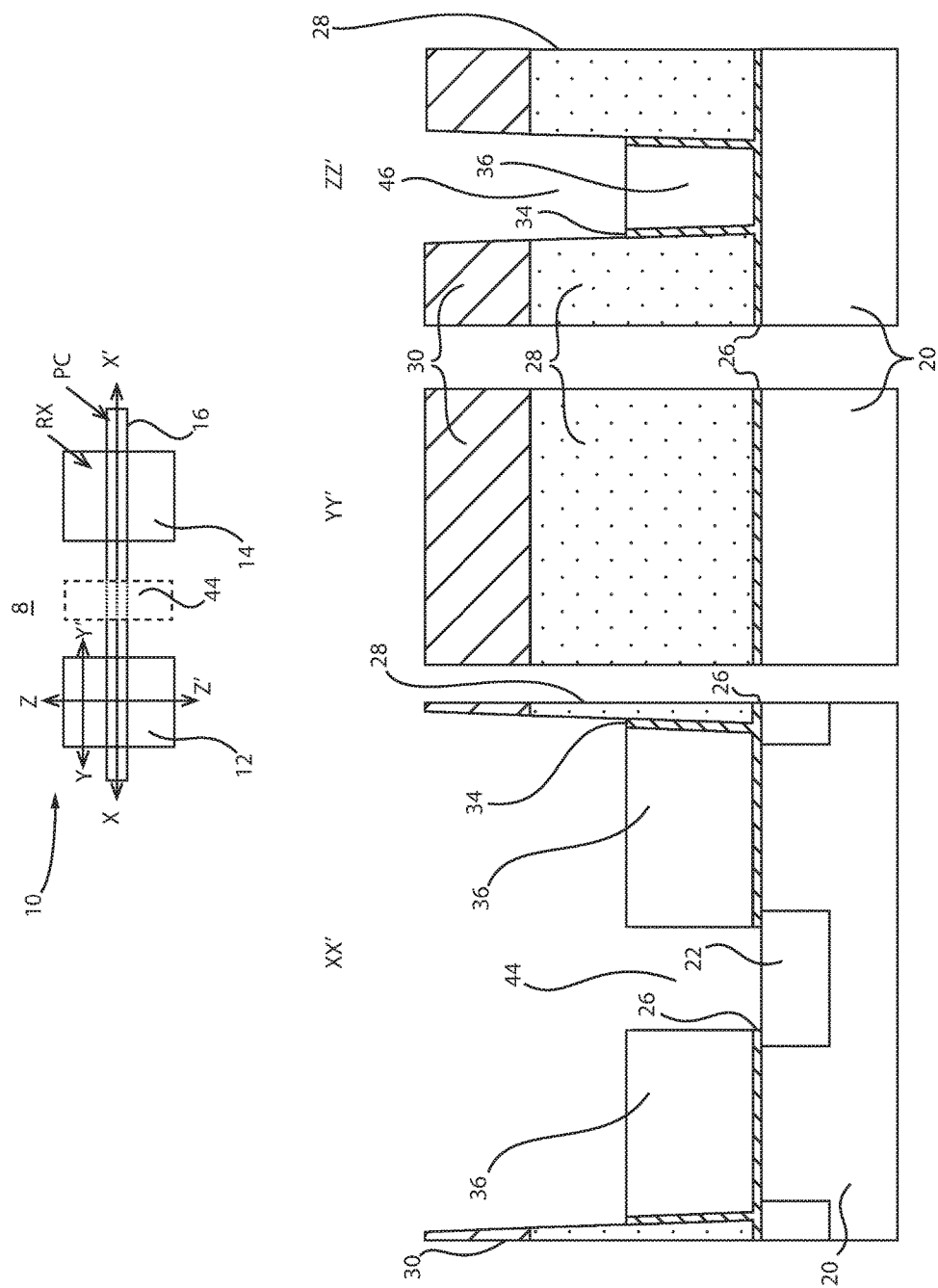
FIG. 6 is a cross-sectional view of the semiconductor device of FIG. 5 showing a schematic top view and two cross-sectional views depicting an extended recess of the dummy gate dielectric and dummy gate conductor to expose a shallow trench isolation region in accordance with the present principles.

Referring to FIG. 6, the ODL 38 is stripped off of the surface of the material 36. Then, the material 36 is recessed by a dry etch or a reactive ion etch to recess the material 36 to form a trench 44 down to the isolation region 22 in section XX'. In section ZZ' the material 36 is also recessed to form recess 46. Trench 44 and recess 46 have sidewalls of material 28 protected from etching using the dielectric layer 34.

Figure 7:
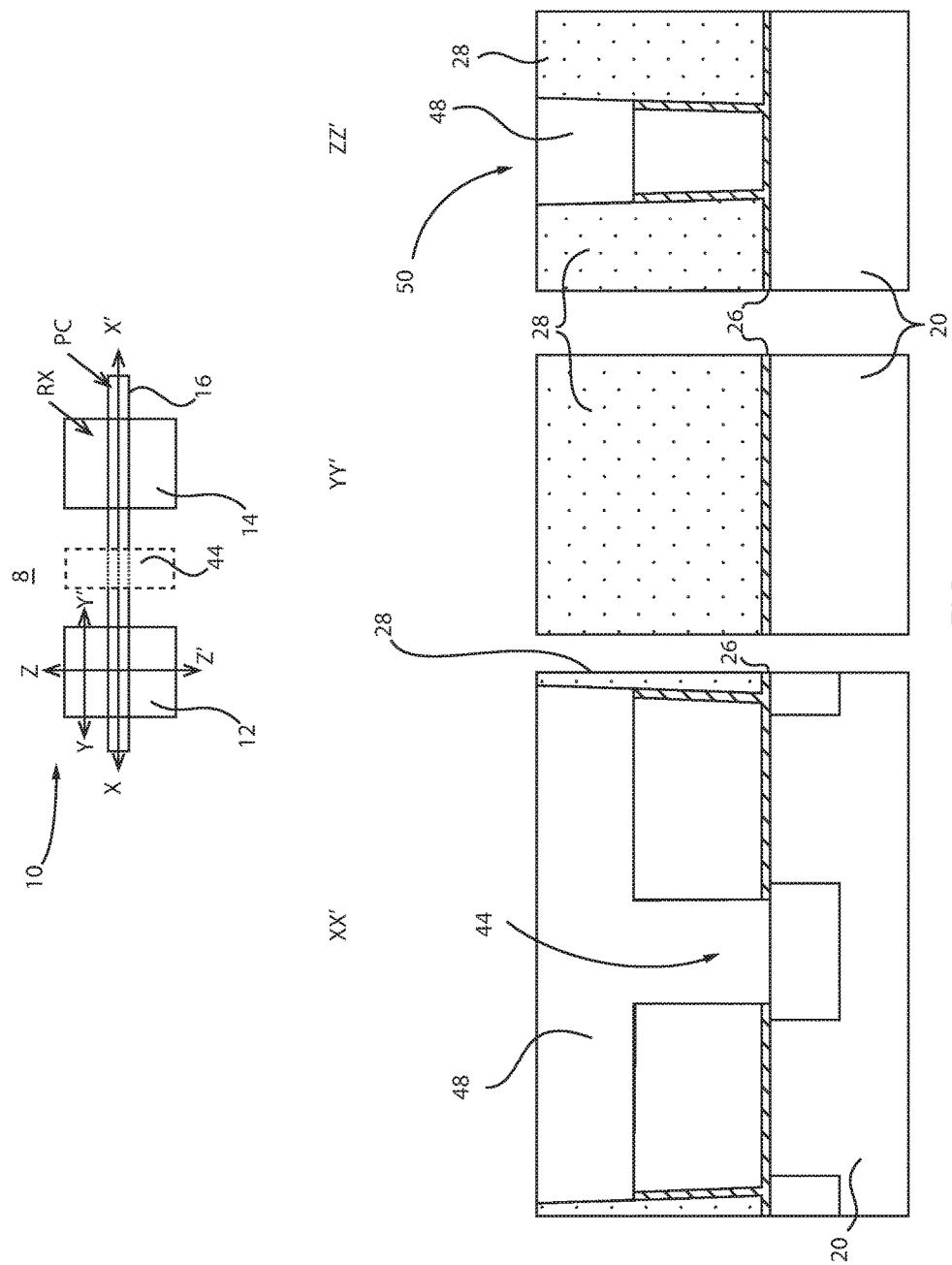
FIG. 7 is a cross-sectional view of the semiconductor device of FIG. 6 showing a schematic top view and two cross-sectional views depicting the trench in the cut region filled with a dielectric material in accordance with the present principles.

Referring to FIG. 7, the trench 44 and recess 46 are filled with a dielectric fill material 48. The dielectric fill material 48 may include silicon nitride or other suitable dielectric material. The dielectric fill material 48 may then be planarized using, e.g., CMP. In this way, a dielectric plug of material 48 lands on the isolation region 22 and extends upward through the cut region (between regions 12 and 14) separating the material 36. In section ZZ', the material 48 acts as a cap layer for a dummy gate structure 50. Here, the dummy gate structure 50 follows the LELE tapered profile.

Figure 8:
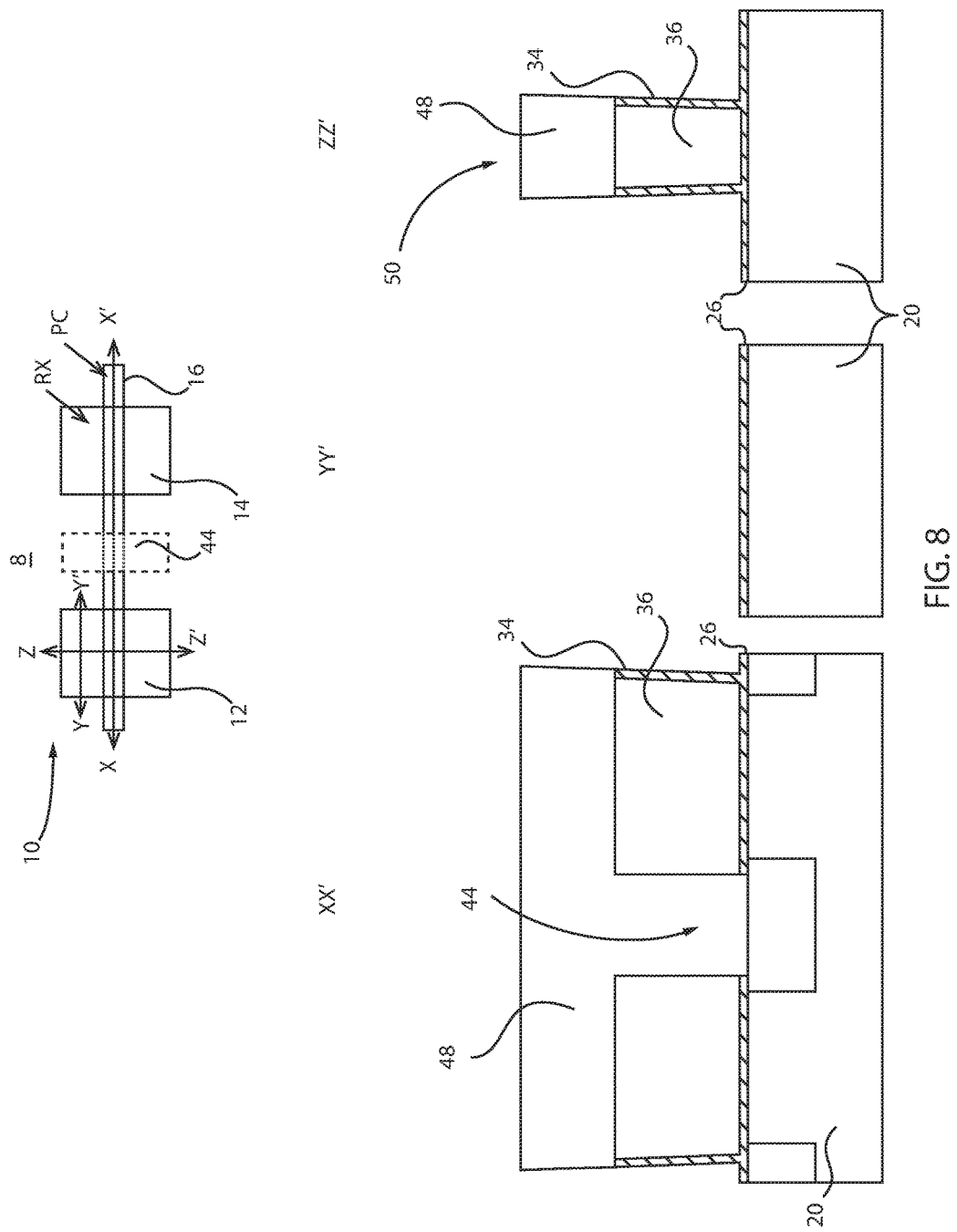
FIG. 8 is a cross-sectional view of the semiconductor device of FIG. 7 showing a schematic top view and two cross-sectional views depicting the dummy layer removed in accordance with the present principles.

Referring to FIG. 8, the material 28 is removed by a selective etch process. The etch selectively removes, e.g., unprotected amorphous silicon selective to, e.g., nitride (fill 48) and oxide (e.g., dielectric 26, 34).

Figure 9:
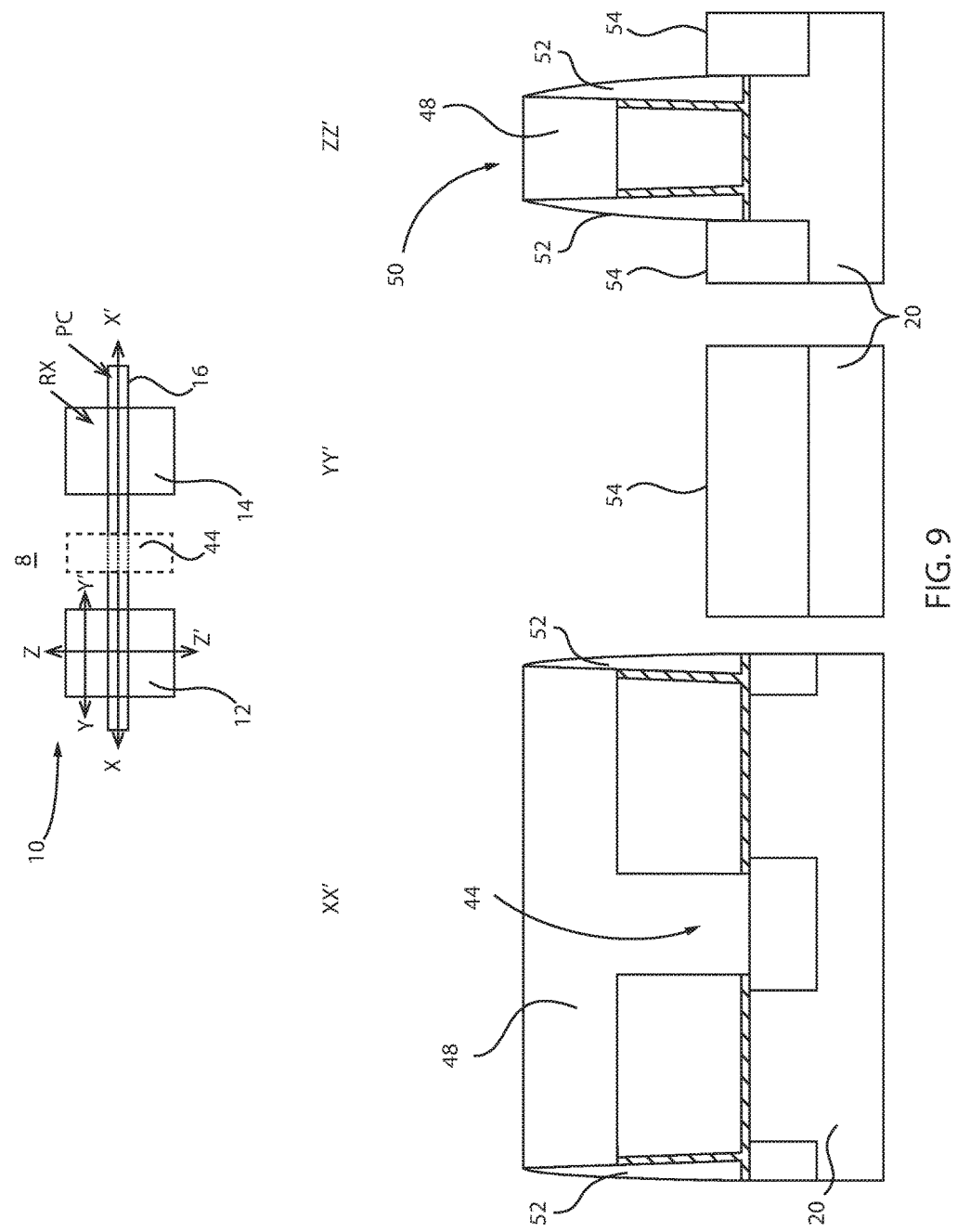
FIG. 9 is a cross-sectional view of the semiconductor device of FIG. 8 showing a schematic top view and two cross-sectional views depicting spacers formed on the gate line and epitaxial contact growth in accordance with the present principles.

Referring to FIG. 9, spacers 52 are formed around gate line 16. Spacers 52 may be formed by depositing a dielectric material, such as SiN and etching by, e.g., RIE to remove the spacer layer from horizontal surfaces. The RIE removes dummy dielectric 26 to expose the substrate 20 (in sections YY' and ZZ'). An epitaxial growth process, e.g., molecular beam epitaxy, or the like) is performed to grow source and drain (S/D) regions 54 (or S/D contacts). The S/D regions 54 may be doped in-situ or after formation. The portion of layer 48 in trench 44 blocks epitaxial shorts between source and drain regions 54 across the cut region (e.g., between region 12 and region 14).

Figure 10:
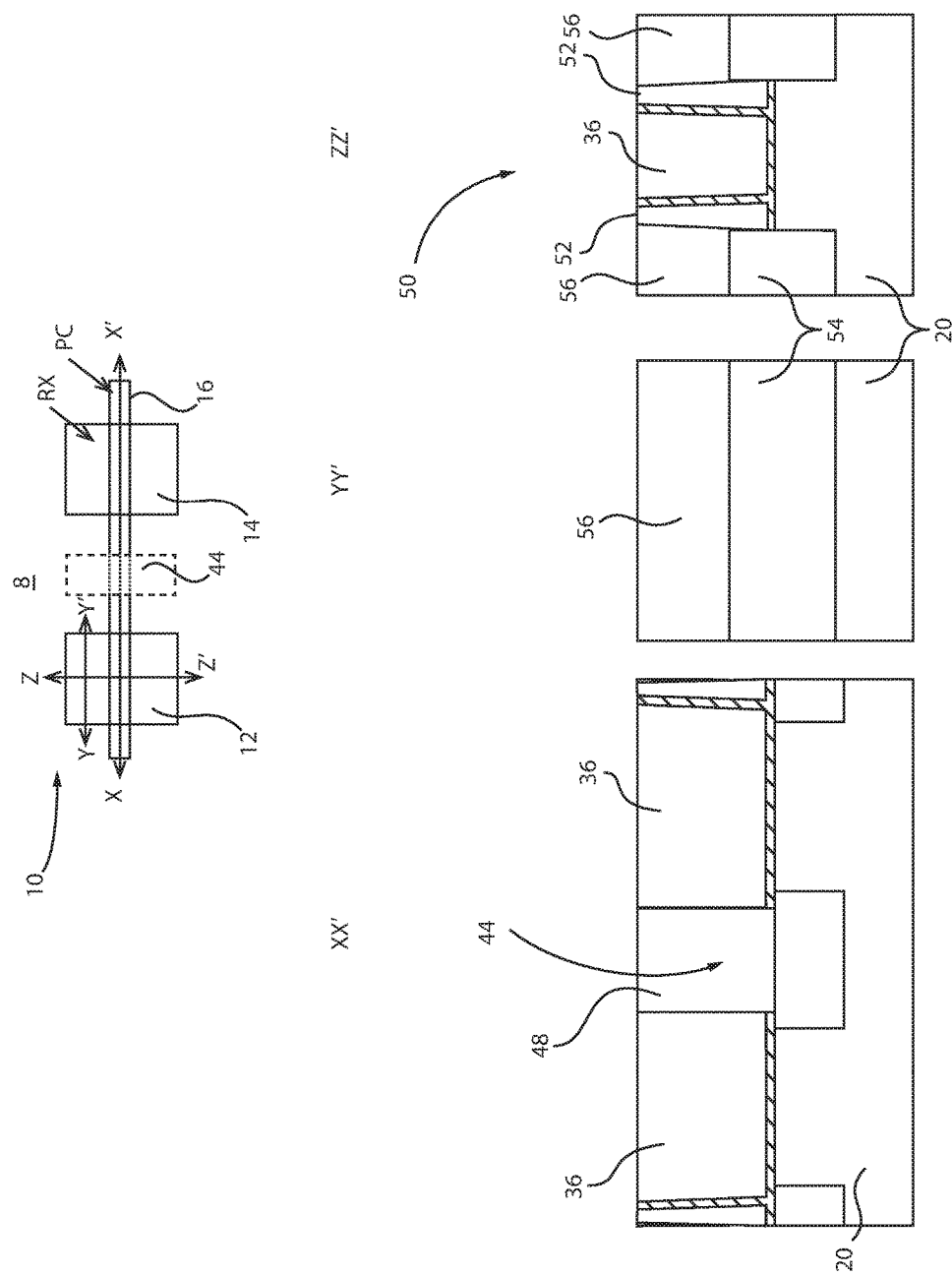
FIG. 10 is a cross-sectional view of the semiconductor device of FIG. 9 showing a schematic top view and two cross-sectional views depicting an interlevel dielectric layer formed and planarized to expose the dummy gate conductor in accordance with the present principles.

Referring to FIG. 10, a gap fill process is performed. A gap fill dielectric 56 is deposited over the device 8. The gap fill dielectric 56 may include a flowable material, such as a flowable oxide. The gap fill dielectric 56 forms a portion of the Interlevel Dielectric (ILD). The gap fill dielectric 56 is then planarized, e.g., by CMP, to expose the material 36 (in line 16 and structure 50).

Figure 11:
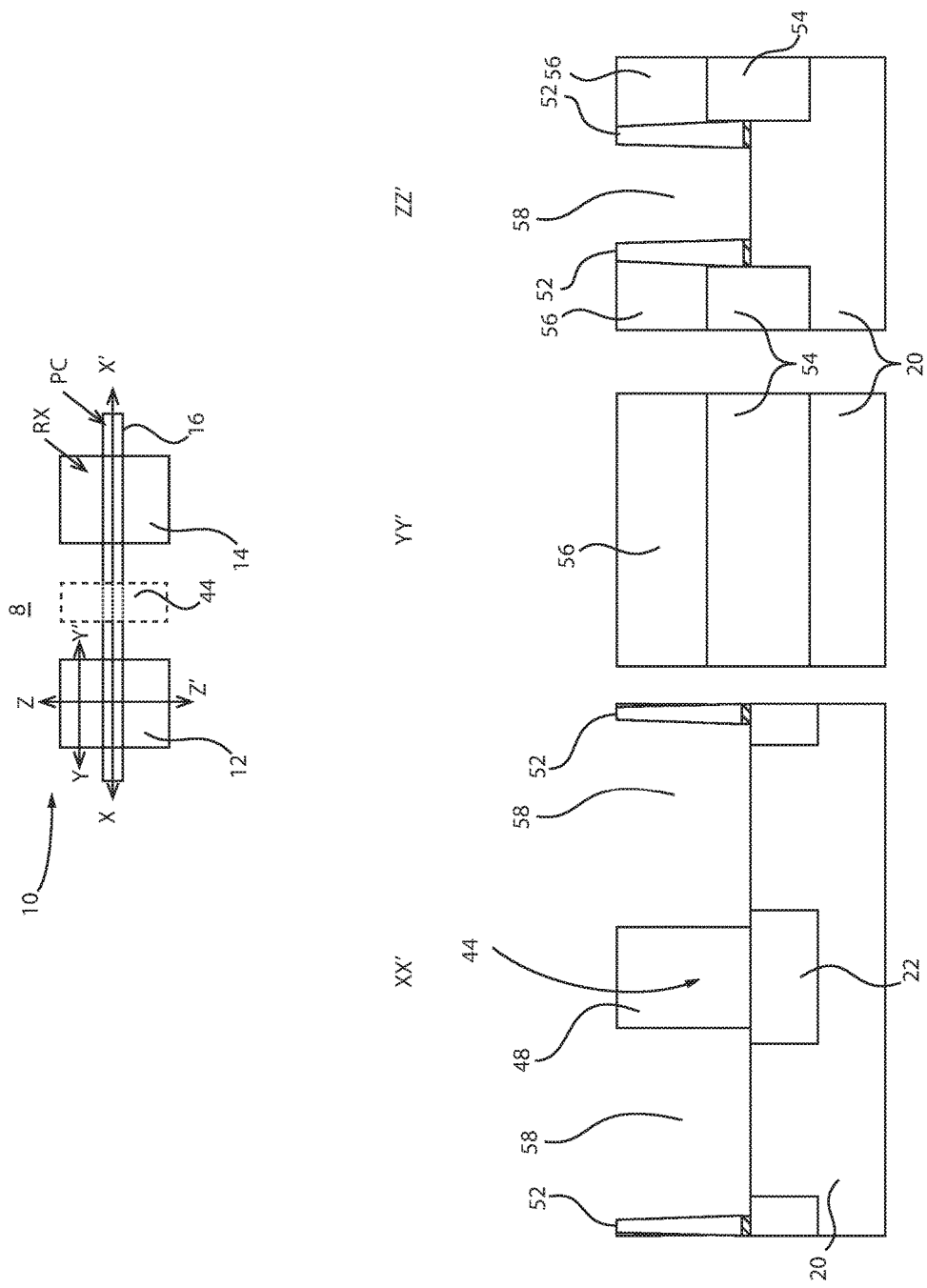
FIG. 11 is a cross-sectional view of the semiconductor device of FIG. 10 showing a schematic top view and two cross-sectional views depicting the dummy gate conductor removed in accordance with the present principles.

Referring to FIG. 11, the material 36 (dummy gate) is removed by selective etching to expose the dummy gate dielectric layer 26 (in sections XX' and ZZ') in trenches 58. The dummy gate dielectric layer 26 is then removed.

Figure 12:
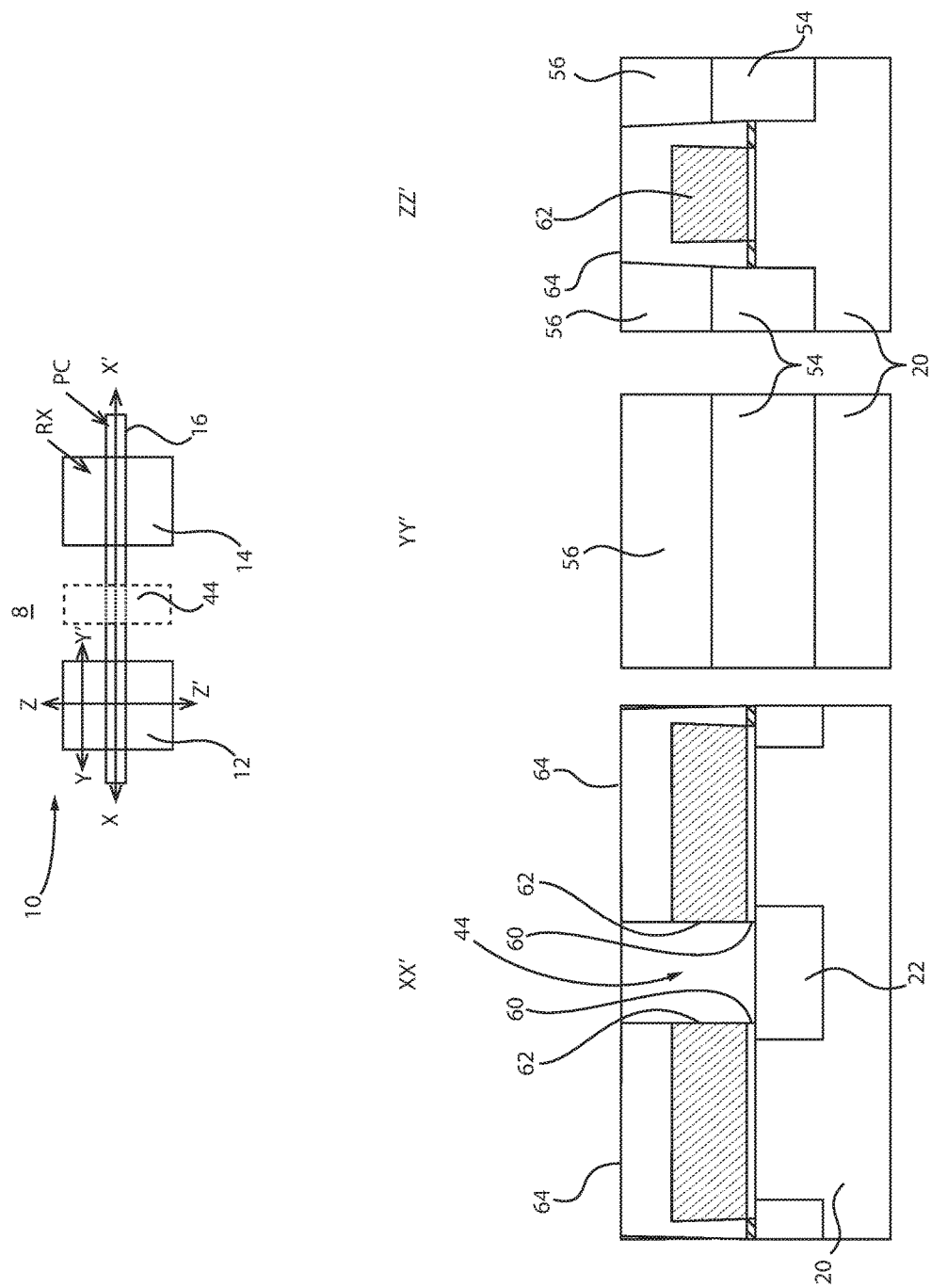
FIG. 12 is a cross-sectional view of the semiconductor device of FIG. 11 showing a schematic top view and two cross-sectional views depicting a gate dielectric, gate conductor and gate cap formation in accordance with the present principles.

Referring to FIG. 12, gate structures are formed by etching the dummy gate dielectric 26 and depositing a gate dielectric 60. The gate dielectric 60 may include a high-k dielectric material (e.g. $HfO_2$). A gate metal 62 is deposited (the gate dielectric 60 is formed below the gate metal 62). The gate metal 62 may include a work function metal and/or other metal layers. In accordance with one aspect of the present principles, the tapered profile provided for the gate opening permits the formation of thin metal layers without the issue of pinch-off. In one embodiment, the metal layers 62 may include a work function metal (e.g., Ti, Pt) and a bulk metal (e.g., W). The metal layers 62 for the gate metal may be formed by conformal deposition processes followed by a CMP process. Then, a gate cap layer 64 may be deposited and planarized. The gate cap layer 64 may include silicon nitride or other dielectric material. Other gate formation processes may also be performed.

Figure 13:
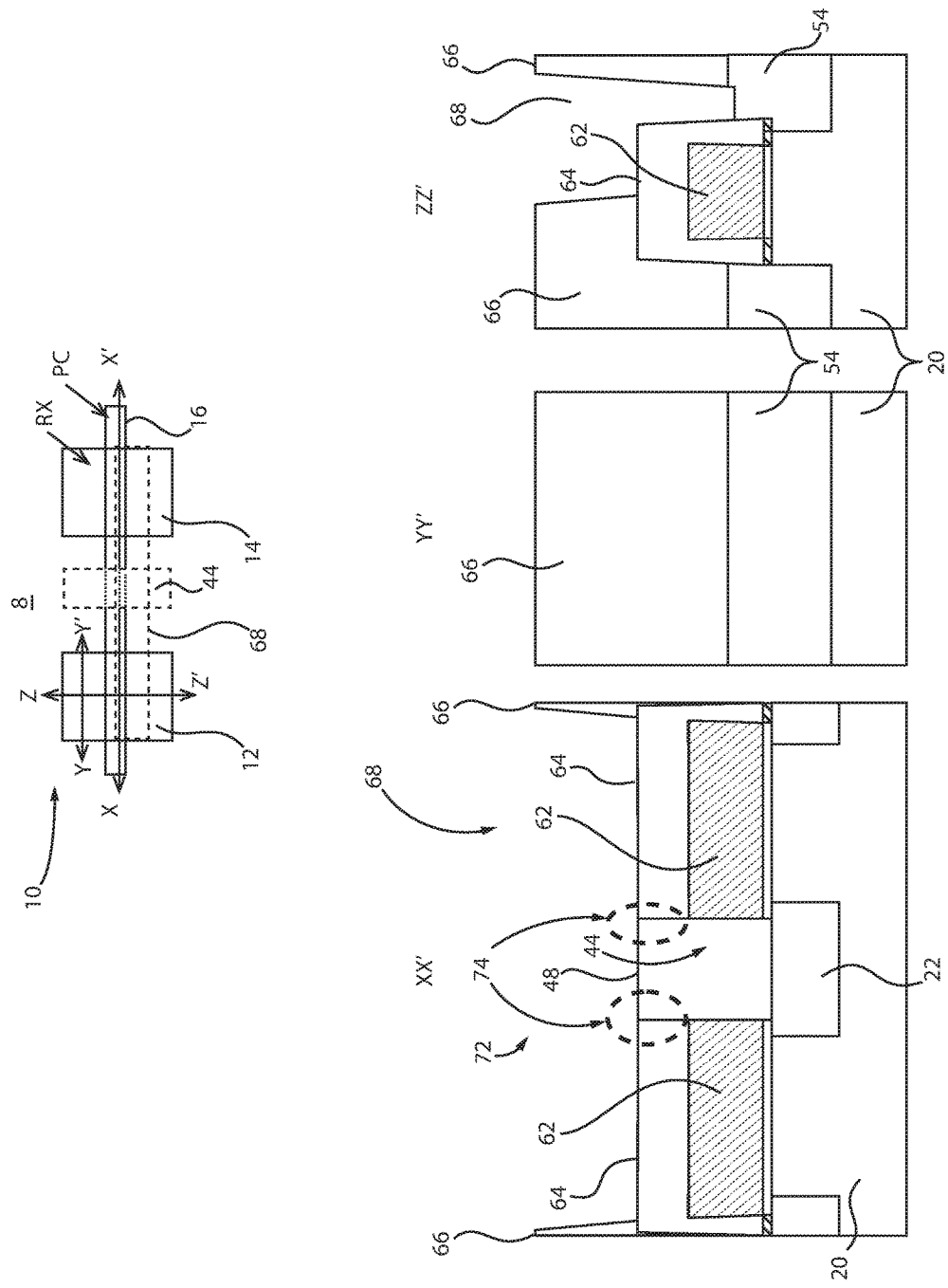
FIG. 13 is a cross-sectional view of the semiconductor device of FIG. 12 showing a schematic top view and two cross-sectional views depicting an interlevel dielectric layer extended and patterned to form contact holes in accordance with the present principles.

Referring to FIG. 13, the ILD layer (56) is extended by an additional deposition process to form layer 66. Layer 66 (ILD) may include oxide although other dielectric materials may be employed. The ILD 66 is opened up to form trenches 68 for the formation of contacts. The ILD 66 is patterned to expose S/D regions 54 for landing a self-aligned contact (SAC) after trench etching and stripping any protective layer on the epitaxial surface. Prior to forming the contact conductor (not shown) a siliciding process may be performed to form a silicide on a contact landing position. The contact and silicide, when formed in the trenches 68, are electrically isolated from the gate metal 62 by layer 48 and cap layer 64. The cap layer 64 extends over a top and sides of the gate metal 62, and the layer 48 separates the gate metals between regions 12 and 14. Region 44 also isolates S/D regions between regions 12 and 14. A cut last structure 72 includes vertical interface regions 74 between the cap layer 64 and the region 44 to provide substantial protection from shorts in epitaxially grown material, and for shorts between contact and/or silicide materials.

Figure 14:
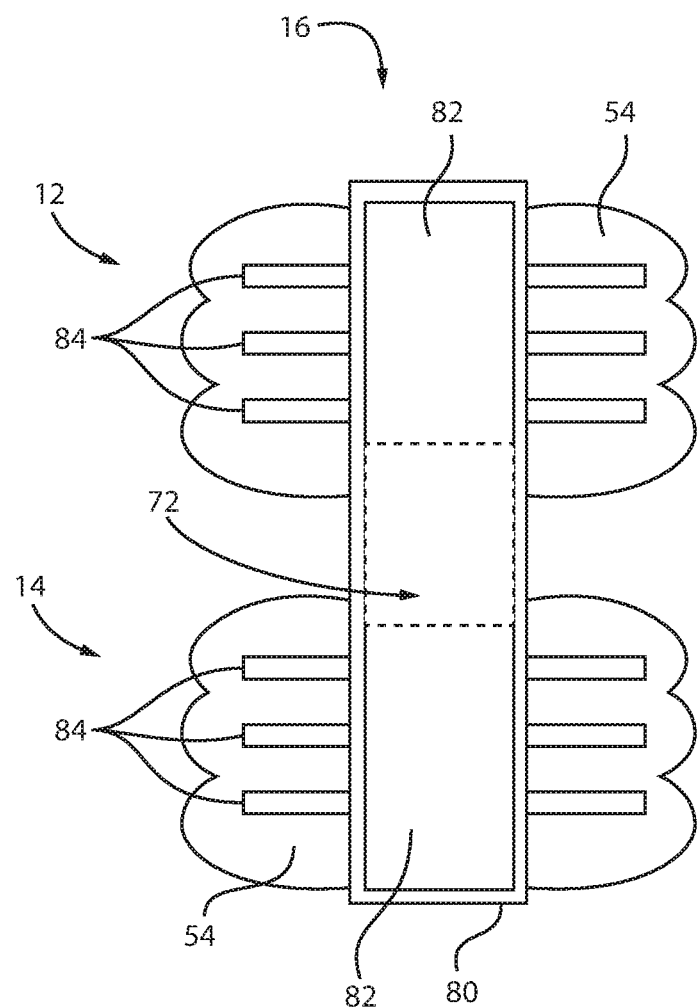
FIG. 14 is a top schematic view showing a gate cut last region/structure in accordance with the present principles.

Referring to FIG. 14, a top schematic view shows a gate cut last region/structure 72. Gate regions 82 are disposed between S/D regions. The S/D regions in this embodiment include epitaxial growth regions 54 and fins 84. The gate line 16 runs through adjacent active regions 12 and 14. A spacer 80 is formed around the gate line 16.

In accordance with the present principles, the gate structure 16 is formed in a tapered profile that permits the formation of thin materials without pinch-off. This profile enables the use of smaller gate structures, e.g., sub-17 nm structures, and preferably 7 nm or less. In addition, the patterning process for the gate structure is also easier to perform since e.g., a LELE process may be employed to form a trench. S/D to S/D region shorts (in adjacent areas), and gate line to contact and/or silicide region shorts are significantly reduced or eliminated. Further, in accordance with the present embodiments, there is no need for multiple flowable oxide deposition steps to form the cut last structure.

Figure 15:
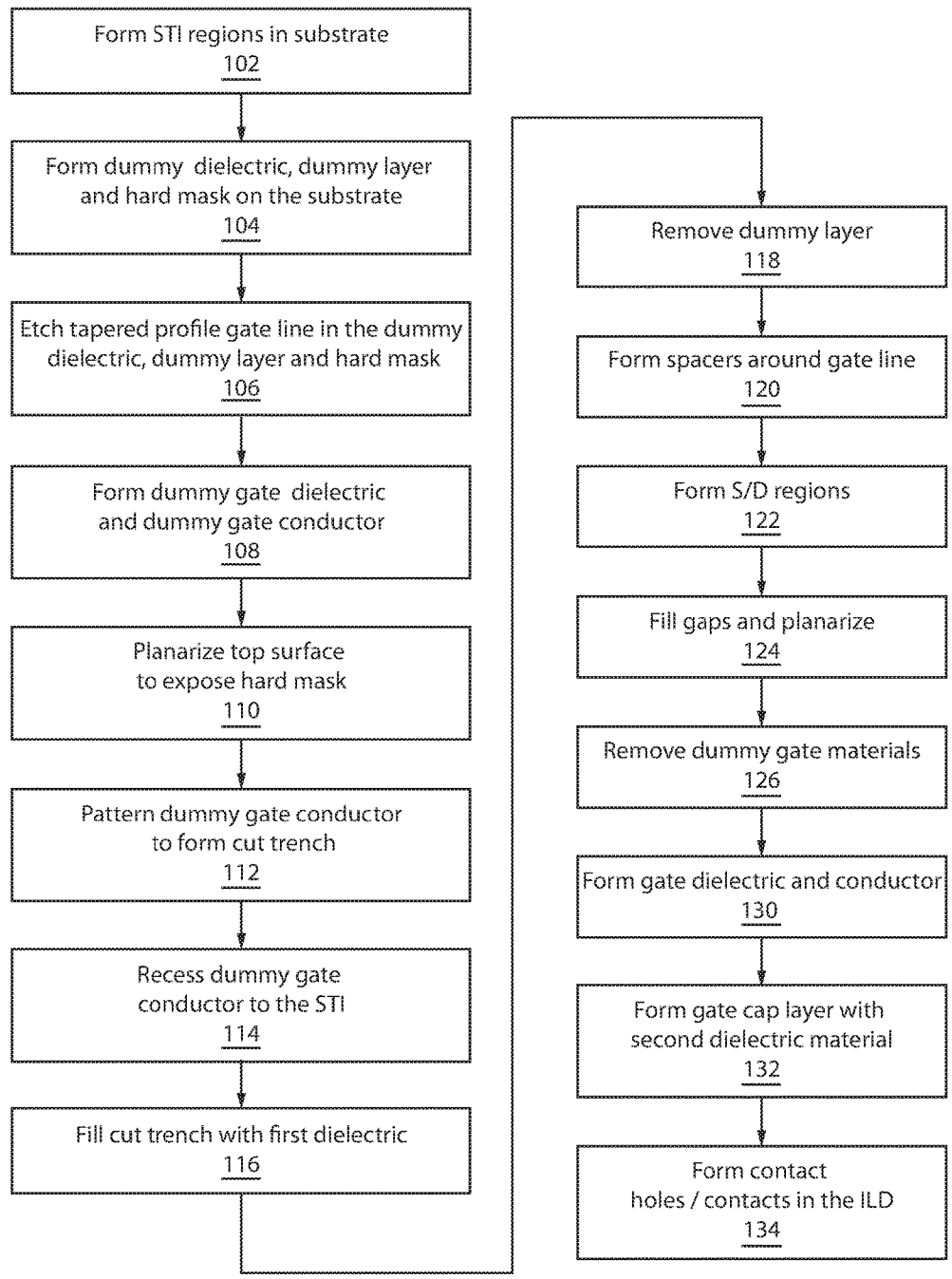
FIG. 15 is a block/flow diagram showing a method for forming a gate cut region in accordance with illustrative embodiments.

Referring to FIG. 15, a method for forming a gate cut region is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, shallow trench isolation (STI) regions are formed in a substrate wherein one STI region corresponds to a central portion of a cut region. The substrate may include a bulk substrate or a semiconductor-on-insulator substrate. In block 104, a hard mask, a dummy layer and a dummy dielectric are formed on the substrate. In block 106, a tapered profile gate line trench is etched through the hard mask, the dummy layer and the dummy dielectric. The tapered profile gets larger the further the distance from the substrate. The tapered profile helps to eliminate pinch-off of metal layers (e.g., WFM, etc.) when depositing the metal layers in the gate trench. The tapered profile gate line trench may be etched using a lithography, etch, lithography, etch (LELE) process, which can form a near perfect taper.

In block 108, a dummy gate dielectric and a dummy gate conductor are formed in the trench. In block 110, a top surface is planarized to reach (expose) the hard mask. In block 112, the dummy gate conductor is patterned and partially recessed to form a cut trench in the cut region. In block 114, the patterning layer is removed, and the dummy gate conductor and dummy gate dielectric are recessed to expose the STI region in the substrate. Recessing the dummy gate conductor includes forming a deeper recess at a central portion of the cut region than side regions and recessing the central portion to first expose the one STI region.

In block 116, the cut trench is filled with a first dielectric material. The first dielectric material may include SiN, although other dielectric materials may be employed. In block 118, the dummy layer is removed. The dummy gate dielectric can provide an etch stop layer for removing the dummy layer. In block 120, spacers are formed about a gate line exposed by removing the dummy layer.

In block 122, source and drain regions may be epitaxially grown adjacent to the spacers. In block 124, gaps are filled using an interlevel dielectric (ILD) deposition. In block 126, the ILD is planarized to open up the gate line to expose and remove the dummy gate conductor from the tapered profile gate line trench. In block 130, a gate dielectric and gate conductor are deposited in the tapered profile gate line trench. In block 132, a gate cap layer is formed to cap a gate structure and provides a second dielectric that is coupled to the first dielectric material in the cut trench to form a cut last structure. In block 134, the ILD is extended over the gate line and etched to form contact holes in the ILD, stopping on the second dielectric material in the cut region for a self-aligned contact etch. The second dielectric material may include SiN, although other dielectric materials may be employed.

Having described preferred embodiments for trench formation for dielectric filled cut region (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a gate cut region, comprising:
   forming a tapered profile gate line trench through a hard mask, a dummy layer and a dummy dielectric formed on a substrate;
   forming a dummy gate dielectric and a dummy gate conductor in the trench;
   planarizing a top surface to reach the hard mask;
   patterning the dummy gate conductor to form a cut trench in a cut region;
   recessing the dummy gate conductor to expose a shallow trench isolation region in the substrate;
   filling the cut trench with a first dielectric material;
   removing the dummy layer;
   forming spacers about a gate line;
   filling gaps using an interlevel dielectric (ILD) deposition;
   opening up the gate line to expose and remove the dummy gate conductor from the tapered profile gate line trench;
   depositing a gate dielectric and gate conductor in the tapered profile gate line trench; and
   forming a gate cap layer to cap a gate structure and provide a second dielectric that is coupled to the first dielectric material in the cut trench to form a cut last structure.

2. The method as recited in claim 1, wherein the forming a tapered profile gate line trench includes etching the tapered profile gate line trench using a lithography, etch, lithography, etch (LELE) process.

3. The method as recited in claim 1, wherein the first dielectric and the second dielectric include silicon nitride.

4. The method as recited in claim 1, further comprising epitaxially growing source and drain regions adjacent to the spacers.

5. The method as recited in claim 1, wherein the dummy gate dielectric provides an etch stop layer for removing the dummy layer.

6. The method as recited in claim 1, wherein recessing the dummy gate conductor includes forming a deeper recess at a central portion of the cut region than side regions and recessing the central portion to first expose the shallow trench isolation region.

7. The method as recited in claim 1, further comprising forming an interlevel dielectric layer over the gate line and etching contact holes in the ILD stopping on the second dielectric material in the cut region.

8. A method for forming a gate cut region, comprising:
   forming shallow trench isolation (STI) regions in a substrate wherein one STI region corresponds to a central portion of a cut region;
   forming a hard mask, a dummy layer and a dummy dielectric on the substrate;
   etching a tapered profile gate line trench through the hard mask, the dummy layer and the dummy dielectric;
   forming a dummy gate dielectric and a dummy gate conductor in the trench;
   planarizing a top surface to reach the hard mask;
   patterning the dummy gate conductor to form a cut trench in the cut region;
   recessing the dummy gate conductor to expose the one STI region in the substrate;
   filling the cut trench with a first dielectric material;
   removing the dummy layer;
   forming spacers about a gate line exposed by removing the dummy layer;
   epitaxially growing source and drain regions adjacent to the spacers;
   filling gaps using an interlevel dielectric (ILD) deposition;
   planarizing the ILD to open up the gate line to expose and remove the dummy gate conductor from the tapered profile gate line trench;
   depositing a gate dielectric and gate conductor in the tapered profile gate line trench; and forming a gate cap layer to cap a gate structure and provide a second dielectric that is coupled to the first dielectric material in the cut trench to form a cut last structure.

9. The method as recited in claim 8, wherein the etching a tapered profile gate line trench includes etching the tapered profile gate line trench using a lithography, etch, lithography, etch (LELE) process.

10. The method as recited in claim 8, wherein the first dielectric and the second dielectric include silicon nitride.

11. The method as recited in claim 8, wherein the dummy gate dielectric provides an etch stop layer for removing the dummy layer.

12. The method as recited in claim 8, wherein recessing the dummy gate conductor includes forming a deeper recess at a central portion of the cut region than side regions and recessing the central portion to first expose the one STI region.

13. The method as recited in claim 8, further comprising forming an interlevel dielectric layer over the gate line and etching contact holes in the ILD stopping on the second dielectric material in the cut region.

* * * * *